United States Patent [19]

Ogawa

[11] Patent Number: 5,410,561
[45] Date of Patent: Apr. 25, 1995

[54] OPTICAL WAVELENGTH CONVERTER FOR OBTAINING WAVELENGTH CONVERSION EFFICIENCY

[75] Inventor: Tsuyoshi Ogawa, Kanagawa, Japan
[73] Assignee: Sony Corporation, Tokyo, Japan
[21] Appl. No.: 111,824
[22] Filed: Aug. 25, 1993
[30] Foreign Application Priority Data Aug. 26, 1992 [JP] Japan .................. 4-227484

[51] Int. Cl.$^6$ .......................... G02F 1/35; H01S 3/109
[52] U.S. Cl. ...................................... 372/22; 359/326; 359/328; 385/122
[58] Field of Search ................. 385/122; 359/326–332; 372/21, 22, 43–50

[56] References Cited

U.S. PATENT DOCUMENTS

| | | | |
|---|---|---|---|
| 4,910,738 | 3/1990 | Fujita et al. | 372/49 X |
| 4,973,117 | 11/1990 | Yamada | 359/328 |
| 5,022,729 | 6/1991 | Tamada et al. | 359/328 |
| 5,077,748 | 12/1991 | Kozlovsky et al. | 372/22 |
| 5,111,468 | 5/1992 | Kozlovsky et al. | 372/32 |
| 5,150,447 | 9/1992 | Tamada et al. | 385/130 |
| 5,155,737 | 10/1992 | Ikeda et al. | 372/43 |
| 5,168,503 | 12/1992 | Maeda | 372/22 |
| 5,175,741 | 12/1992 | Okazaki | 372/21 X |
| 5,177,752 | 1/1993 | Ohya et al. | 372/22 |
| 5,265,110 | 11/1993 | Naya | 372/21 |

FOREIGN PATENT DOCUMENTS

| | | |
|---|---|---|
| 0378061 | 7/1990 | European Pat. Off. . |
| 2-187735 | 7/1990 | Japan . |
| 3-48832 | 3/1991 | Japan . |
| 3-121428 | 5/1991 | Japan . |
| 4-19719 | 1/1992 | Japan . |
| 4-212132 | 8/1992 | Japan . |

OTHER PUBLICATIONS

Japanese Journal of Applied Physics, Pt. 1, vol. 31, Feb. 1992, No. 2b, Tokyo, JP pp. 513–518, "Second-Harmonic Generation Green Laser for Higher-Density Optical Disks", Oka/Kubota.

Philips J. Res. vol. 46, Nos. 4–5, 1992, pp. 231–265, "Blue Second Harmonic Generation in KTP, LiNbO$_3$ and LiTaO$_3$ Waveguides", Jongerius et al., The Netherlands (no month).

Patent Abstracts of Japan, JP4116629, Apr. 17, 1992, abstract pub. date–Aug. 10, 1992, vol. 016371, Ricoh Co. Ltd., Mori Koji et al., "Wavelength Conversion Element and Production Thereof".

*Primary Examiner*—John D. Lee
*Attorney, Agent, or Firm*—Jerry A. Miller

[57] ABSTRACT

A wavelength converter having the light source formed of the semiconductor laser 1 and the nonlinear optical element 2, wherein, the oscillation light therefrom is incident to the nonlinear optical element 2 as an input fundamental wave, and the oscillation wavelength is changed by the very small variation current added to the injection current to the semiconductor laser so that the input fundamental wavelength to the nonlinear optical element 2 is changed and that the oscillation wavelength of the semiconductor laser is pulled in the input fundamental wavelength at which the wavelength conversion efficiency is the maximum.

20 Claims, 8 Drawing Sheets

OPTICAL WAVELENGTH CONVERTER FOR OBTAINING WAVELENGTH CONVERSION EFFICIENCY

FIELD OF THE INVENTION

This invention relates to an optical wavelength converter. More particularly, this invention relates to a wavelength converter having a nonlinear optical element which generates a second harmonic, a fourth harmonic and so on when supplied with a fundamental wave.

BACKGROUND OF THE INVENTION

When a nonlinear optical element has a narrow light harmonic generation wavelength band, a semiconductor laser is sometimes used as the fundamental wave light source. When a semiconductor is used as the fundamental wave light source, the oscillation wavelength drifts with the variation of the ambient temperature. This makes it difficult to generate a second harmonic at the highest efficiency at all times. To alleviate this problem, the semiconductor laser used as the fundamental wave light source and the nonlinear optical element have so far been maintained at a constant temperature. However, even when these components are maintained at constant temperature, wavelength variation cannot be fully reduced. Thus, variations are introduced into the wavelength conversion efficiency and the light harmonic output power making it difficult to maintain these factors at the maximum.

SUMMARY OF THE INVENTION

An object of this invention is to provide a wavelength converter having improved stability.

According to a first embodiment of the present invention, there is provided a wavelength converter having a light source formed of a semiconductor laser, and a nonlinear optical element, wherein light from the semiconductor laser is incident to the nonlinear optical element as an input fundamental wave. The oscillation wavelength of the semiconductor laser is changed by an injection current provided to the semiconductor laser. The injection current is added with a very small variation current, so that the wavelength of the input fundamental wave to the nonlinear optical element is changed and that the oscillation wavelength of the semiconductor laser is pulled in the wavelength of the input fundamental wave at which the wavelength conversion efficiency of the nonlinear optical element is the maximum.

According to a second embodiment of the present invention, there is provided a wavelength converter including a light source, a nonlinear optical element, and an external frequency modulator. Light from the light source is fed to an external frequency modulator. The output light from the external frequency modulator is incident to the nonlinear optical element as an input fundamental wave. A very small modulation signal is supplied to the external frequency modulator, changing the wavelength of the input fundamental wave to the nonlinear optical element by a very small amount so that the output light from the external frequency modulator is pulled in the wavelength at which the wavelength conversion efficiency of the nonlinear optical element is the maximum.

According to a third embodiment of the present invention, there is provided a wavelength converter made of a light source formed of a semiconductor laser and a nonlinear optical element. Oscillation light from the semiconductor laser is incident to the nonlinear optical element as an input fundamental wave. The temperature of the semiconductor laser is changed by a very small amount to change the oscillation wavelength of the semiconductor laser and hence the wavelength of the input fundamental wave to the nonlinear optical element so that the oscillation wavelength of the semiconductor laser is pulled in an input fundamental wavelength at which the wavelength conversion efficiency of the nonlinear optical element is the maximum.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. Where like reference numerals are used in the several views of the drawing, these numerals represent identical or similar components. In those cases, the various components are only described in connection with one figure of the drawing.

For convenience of explanation, before detailed embodiments of the invention are described, the basic principle for making the oscillation wavelength of the semiconductor laser coincident with the wavelength at which the conversion efficiency of the nonlinear optical element is the maximum will be discussed using FIGS. 3, 4, 5, 6, 7 and 8.

Figure 3:
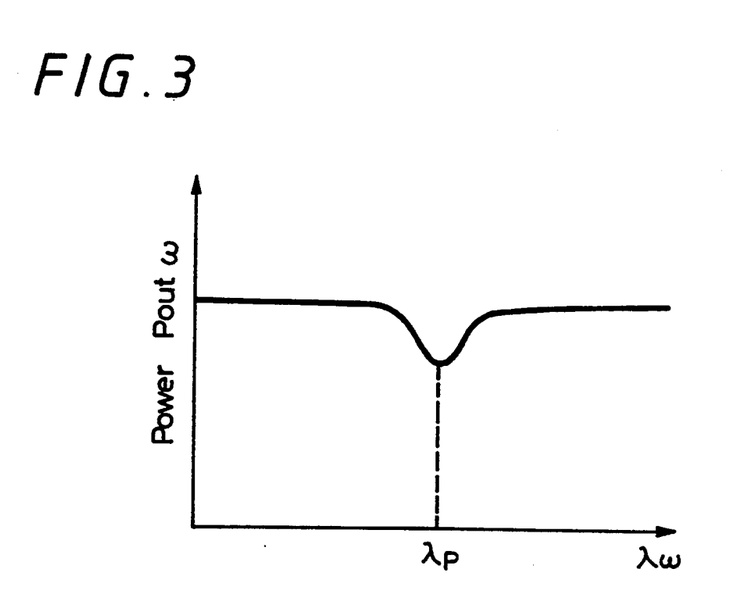
FIG. 3 is a graph showing the relation of power derived from the nonlinear optical element to the wavelength of the fundamental wave light.
Figure 4:
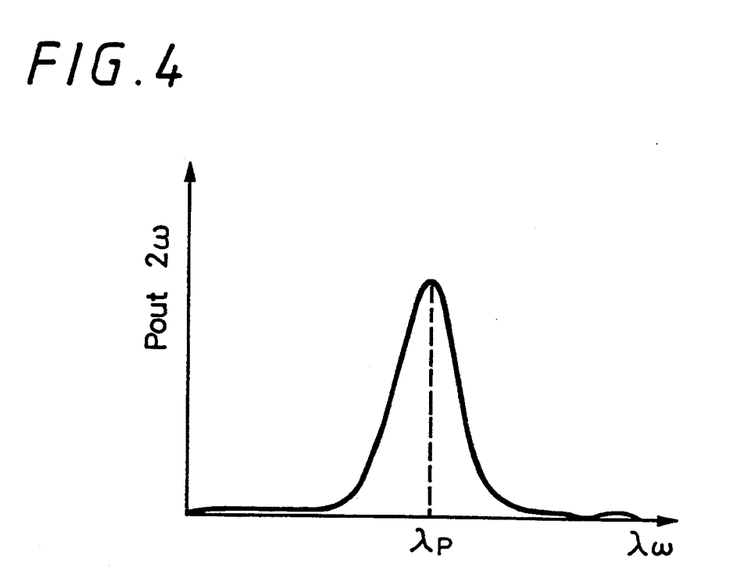
FIG. 4 is a graph showing the relation between the second harmonic output power from the nonlinear optical element and the wavelength.

Now let it be considered that a fundamental wave light beam of input power $P_{in}\omega$ and wavelength $\Delta\omega$ is fed to the nonlinear optical element SHG (Second Harmonic Generator) for generating the second harmonic. FIGS. 3 and 4 respectively show the fundamental wave output power $P_{out}\omega$ and second harmonic output power $P_{out}2\omega$ from the SHG with respect to the fundamental wave input wavelength $\Delta\omega$. In this case, the SHG is of the quasi-phase matching structure.

From these figures, it will be seen that the wavelength-dependency of each of the fundamental wave output power and harmonic wave output power has a peak at a certain wavelength ($\lambda p$) at which the conversion efficiency is the maximum.

Figure 5:
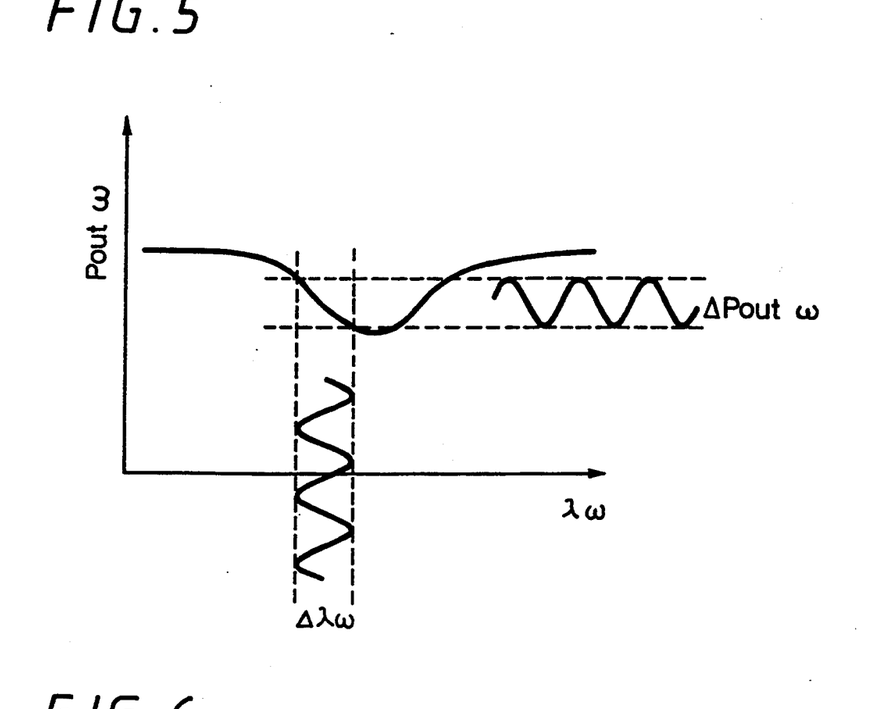
FIG. 5 is a diagram explaining the very small variation of the fundamental wave length to the nonlinear optical element and the output variation thereby.
Figure 6:
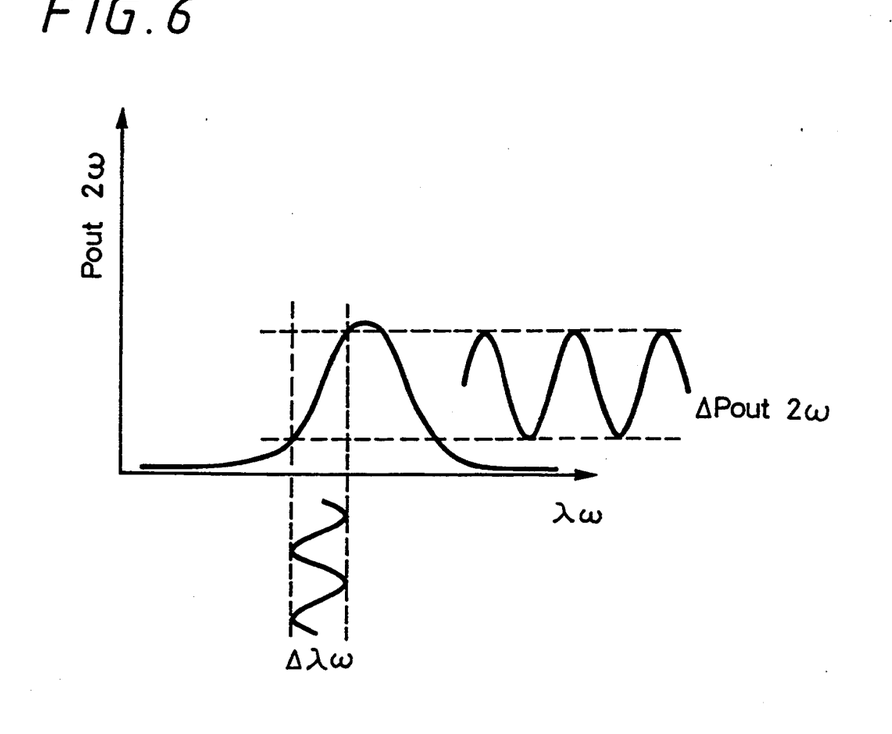
FIG. 6 is a diagram explaining the very small variation of the fundamental wavelength to the nonlinear optical element and the variation of the second harmonic output thereby.

Thus, when the fundamental light wave incident to the SHG has a very small variation signal ($\Delta\lambda\omega$), the light wave output power signal ($\Delta P_{out}\omega$) and light second harmonic wave output power signal ($\Delta P_{out}2\omega$) from the SHG are as shown in FIGS. 5 and 6, respectively.

Figure 7:
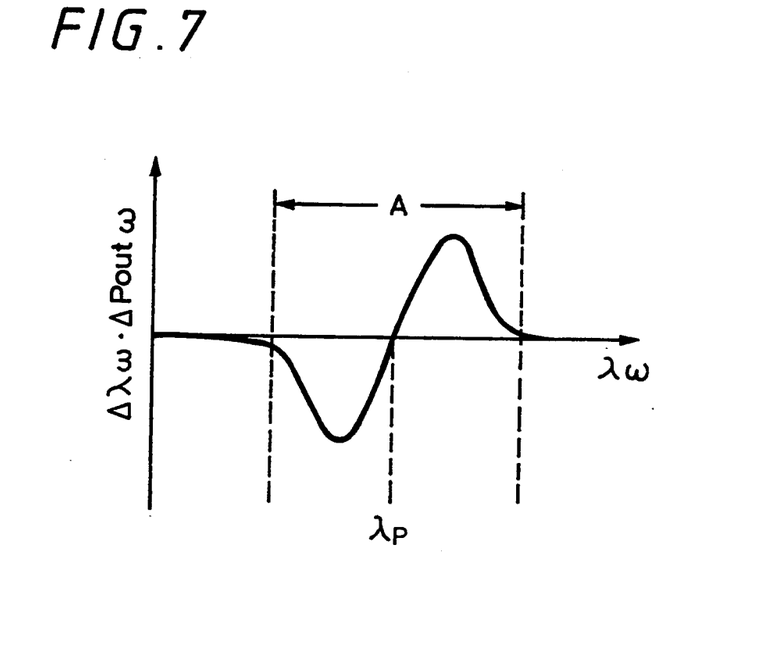
FIG. 7 is a diagram showing the relation between the fundamental wavelength and the inner product of the fundamental wave very small variation signal $\Delta\lambda\omega$ and the fundamental wave output power signal $\Delta P_{out\omega}$.
Figure 8:
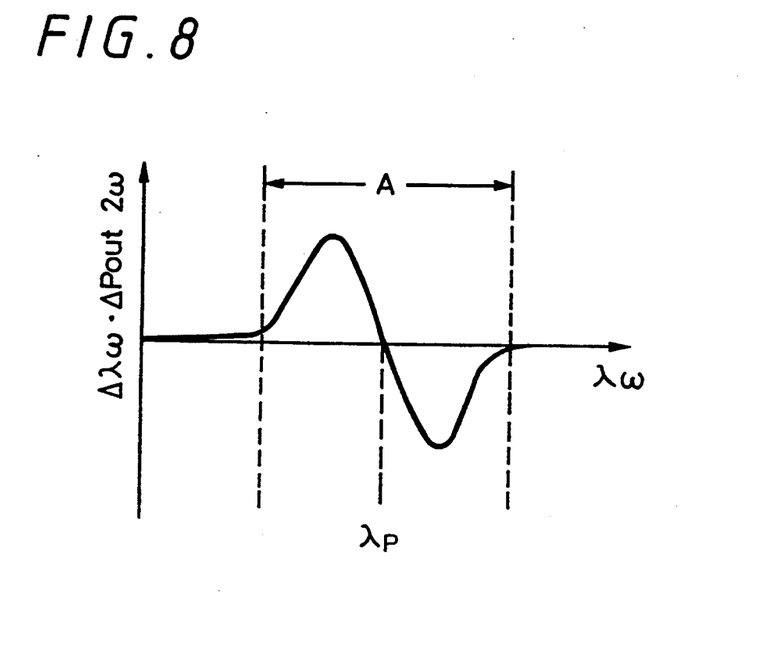
FIG. 8 is a diagram showing the relation between the fundamental wavelength and the inner product of the fundamental wave very small variation signal $\Delta\lambda\omega$ and the light high frequency output power signal $\Delta P_{out2\omega}$.

The inner products taken between $\Delta\lambda\omega$ and the $\Delta P_{out}\omega$ and $\Delta P_{out}2\omega$ are dependent on wavelength as shown in FIGS. 7 and 8. The curves shown in these figures are first-order differential of the characteristic curves shown in FIGS. 3 and 4.

These differential curves have positive and negative wavelength regions (regions A in these graphs) around the wavelength $\lambda P$ at which the conversion efficiency is the maximum. When the fundamental light wave input center wavelength $\lambda\omega$ is present within this region A, the information of whether the wavelength $\lambda\omega$ is higher or lower than the wavelength $\lambda P$ can be obtained as the positive or negative from the signals shown in FIGS. 7 and 8.

Thus, if the input light wavelength $\lambda\omega$ is changed in the direction for the coincidence with $\lambda P$ by negative feedback, the $\lambda\omega$ and $\lambda P$ can be always coincident with each other. The basic arrangement of one embodiment of the invention is shown in FIG. 1.

Figure 1:
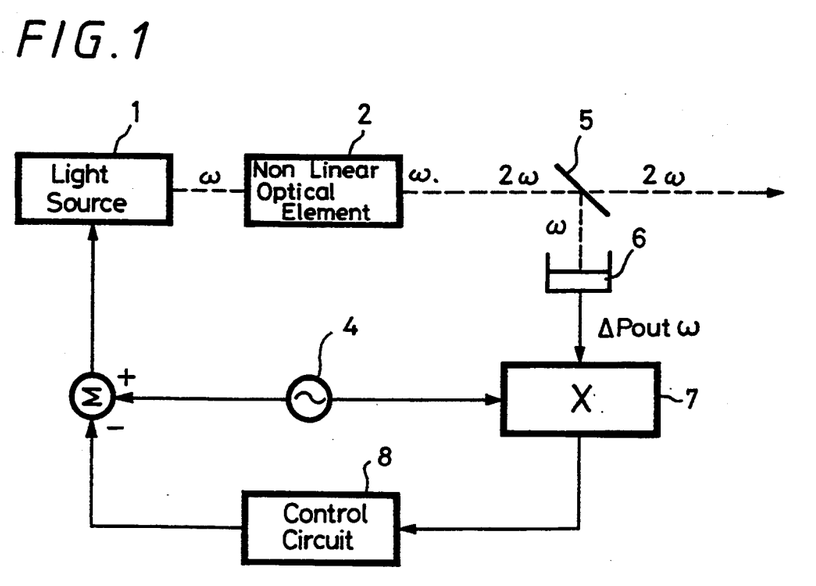
FIG. 1 is a block diagram of one embodiment of the wavelength converter of the present invention.

In FIG. 1, the light source 1 is a semiconductor laser (LD) 1. The semiconductor laser 1 is supplied with and modulated by a very small variation current signal $\Delta\lambda\omega$ of a frequency $f_{ref}$, for example, several tens of KHz in the range from 100 Hz to 100 MHz from a local oscillator 4. This very small variation current signal $\Delta\lambda\omega$ has an AC component of, for example, 0.1% in the range from about 0.001% to 10% with respect to the DC component of the injection current to be supplied to the semiconductor laser 1. In this case, since the output wavelength from the semiconductor laser LD is changed substantially linear with the change of the injection current, the output wavelength from the semiconductor laser LD is modulated directly by the very small variation current.

The modulated output light $\omega$ from the semiconductor laser 1 is incident to the nonlinear optical element 2, by which the second harmonic $2\omega$, for example, is produced by wavelength conversion. This nonlinear optical element 2 also produces part of the incident light $\omega$ without wavelength conversion.

A mirror 5 is disposed after the nonlinear optical element 2. In this embodiment, this mirror 5 is a dichroic mirror which allows the second harmonic light of wavelength $2\omega$ to be passed therethrough but reflects the incident light $\omega$ of a longer wavelength to an optoelectric transducer 6.

The light reflected from the mirror 5 is introduced to an optoelectric transducer 6 such as a photodiode, thereby converting the light into an electric signal. This electric signal is used as the variation current signal $\Delta P_{out}\omega$ which changes with the change of the fundamental wavelength from the semiconductor laser 1 to the nonlinear optical element 2. The characteristics of nonlinear optical element 2 are shown in FIG. 5.

An error signal is obtained by the correlation between the current variation signal $\Delta P_{out}\omega$ from the optoelectric transducer 6 and the very small variation current $\Delta\lambda\omega$ from the local oscillator 4. In this embodiment, the $\Delta P_{out}\omega$ and $\Delta\lambda\omega$ are supplied to a multiplying circuit 7 which then produces the inner product of both signals $\Delta P_{out}\omega$ and $\Delta\lambda\omega$ as illustrated in FIG. 7. The output signal from the multiplying circuit 7 is supplied to a control circuit 8. Thus, the injection current is negatively fed back to the light source 1 (the semiconductor laser LD) so that the output wavelength, or the light input wavelength $\lambda\omega$ to the nonlinear optical element 2 can be made coincident with the $\lambda P$.

Figure 2:
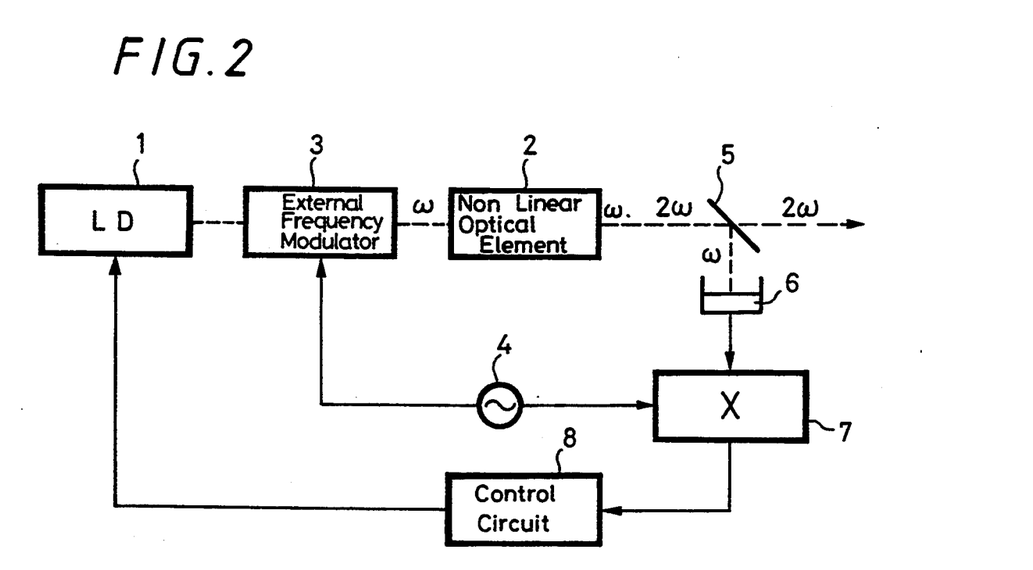
FIG. 2 is a block diagram of another embodiment of the wavelength converter of the present invention.

While in the embodiment of FIG. 1 the semiconductor laser LD of the light source 1 is directly modulated by the very small variation current, the light from the light source 1, may alternatively be supplied to an external frequency modulator 3 as shown in the basic arrangement of FIG. 2. In this embodiment, the frequency-modulated light is incident to the nonlinear optical element 2 as an input fundamental wave. The very small variation current from the local oscillator 4 is supplied to the external frequency modulator 3 as a frequency modulation signal, thus frequency-modulating the incident light to the nonlinear optical element 2. In the arrangement of FIG. 2, the same error signal detection and negative feedback as in FIG. 1 are performed. In FIG. 2, like elements corresponding to those in FIG. 1 are identified by the same reference numerals and will not be described.

Figure 9:
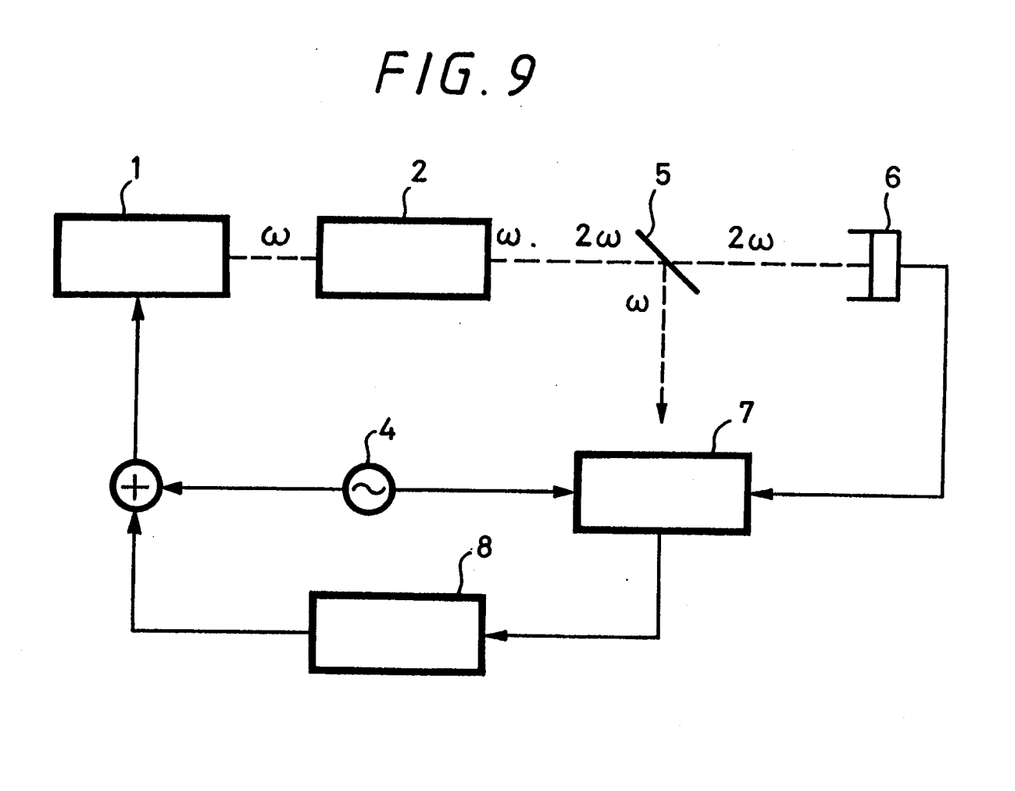
FIG. 9 is a block diagram of another embodiment of the waveform converter of the invention.
Figure 10:
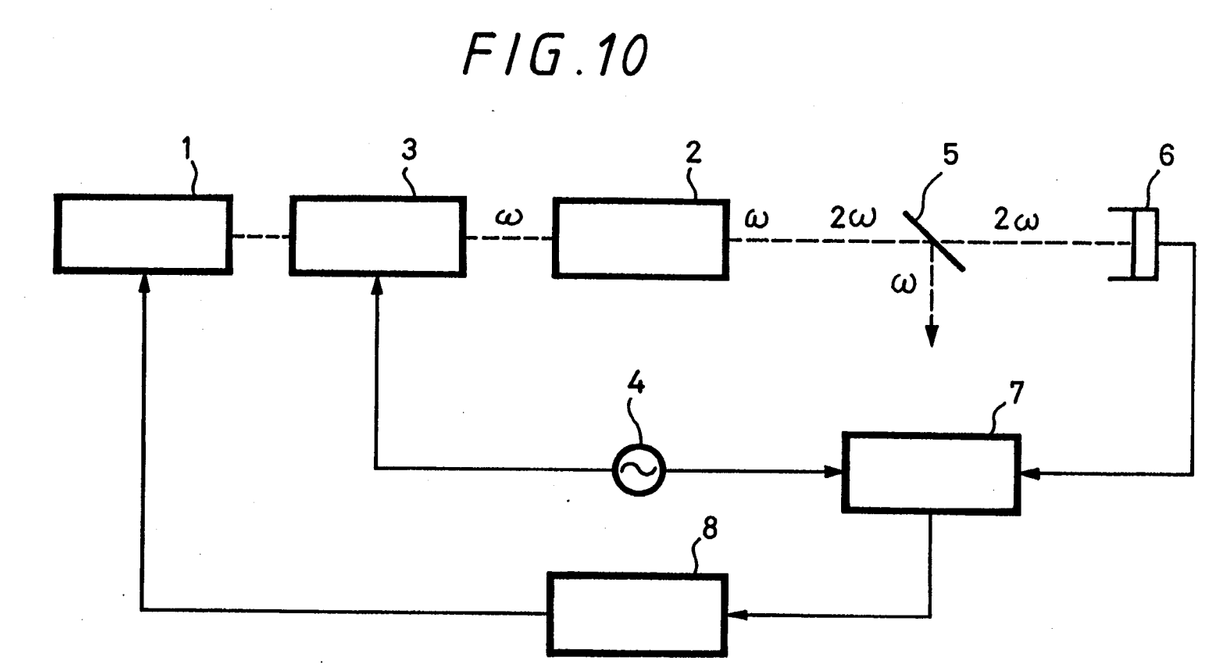
FIG. 10 is a block diagram of another embodiment of the waveform converter of the invention.

While in the embodiments of FIGS. 1 and 2 the fundamental wavelength output from the nonlinear optical element 2 is detected to produce the error signal, the waveform-converted output light from the nonlinear optical element 2, or the light passed through the mirror 5 may be detected to produce the error signal as shown in FIGS. 9 and 10. In FIGS. 9 and 10 the second harmonic signal $2\omega$ passes through mirror 5 to the optoelectric transducer 6. Otherwise, in FIGS. 9 and 10, like elements corresponding to those in FIGS. 1 and 2 are identified by the same reference numerals and will not be described.

Figure 11:
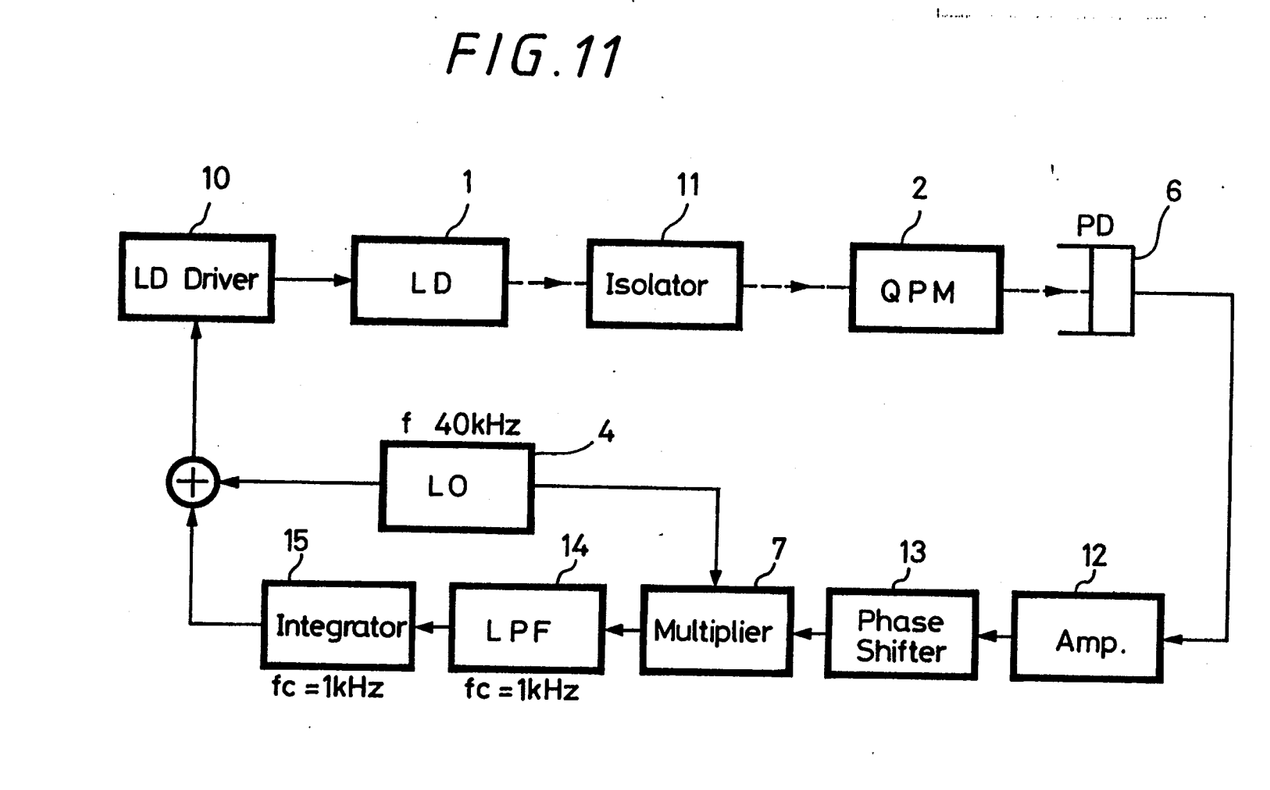
FIG. 11 is a block diagram of another embodiment of the waveform converter of the invention.

FIG. 11 is a block diagram of a specific circuit arrangement of the wavelength converter of the invention shown in FIGS. 1 or 9. In FIG. 11, element 10 represents a driver circuit for driving the semiconductor laser LD of the light source 1. After the semiconductor laser LD, an isolator 11 is provided to prevent the return of light to the laser LD.

The LD driver 10 adds a very small variation current to the injection current driving the laser LD. This very small variation current is provided by the signal of, for example, 40 kHz from the local oscillator 4, changing the oscillation wavelength from the semiconductor laser LD by a very small amount.

The oscillation light from the semiconductor laser LD is incident to the nonlinear optical element 2 of, for example, QPM (quasi-phase matching) type, as a fundamental wave. The nonlinear optical element 2 produces the second harmonic. This second harmonic light is detected by the optoelectric transducer 6 such as a photodiode. The detected signal is amplified by an amplifier 12 and fed to a phase shifter 13, where it is synchronized with the signal from the local oscillator 4. The output from the phase shifter and the signal from the local oscillator 4 are supplied to the multiplying circuit 7, and the output therefrom is fed to a low-pass filter 14 of a cutoff frequency fc of, for example, 1 kHz. The output signal from the low-pass filter is fed to an integrator 15 of a cutoff frequency fc of, for example, 1 kHz. The output signal from the integrator is added to the oscillation output from the local oscillator 4, and fed to the driver circuit 10, thus making the negative feedback to the laser LD as previously described with reference to the basic arrangement of FIG. 1.

Figure 12:
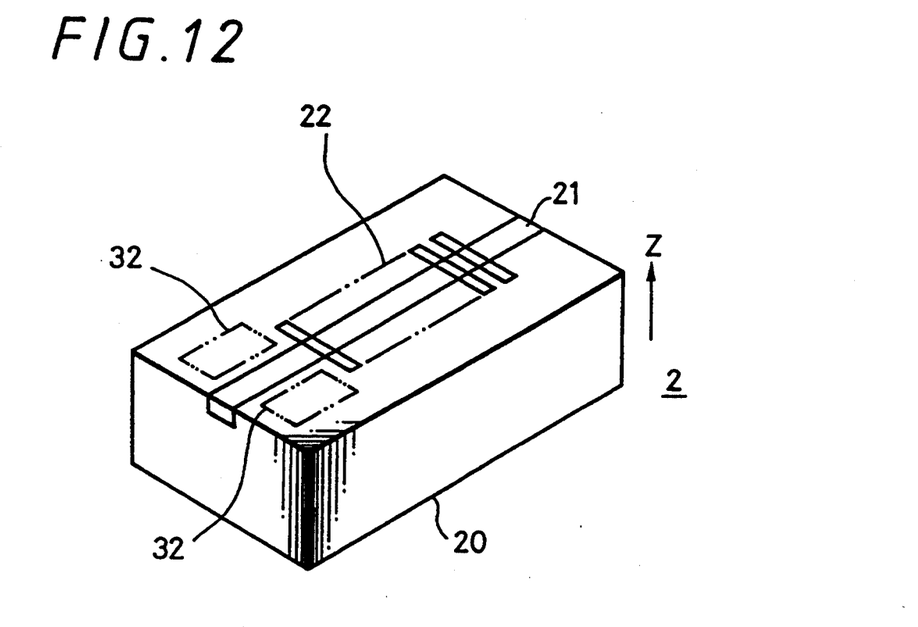
FIG. 12 is a perspective view of one example of the nonlinear optical element.

FIG. 12 shows one example of the nonlinear optical element 2 of quasi phase matching (QPM) type, for example, SHG. An optical waveguide 21 is formed in a nonlinear optical crystal of KTP (Potassium Titanyl Phosphate—KTiOPO$_4$) or the like formed of a substrate 20 in which the Z-axis (C-axis) is taken in the width direction. In addition, polarity-inverted structural portions 22 are formed in the crystal to cross, for example, the optical waveguide 21 in its width direction with their polarities alternately inverted.

Figure 13:
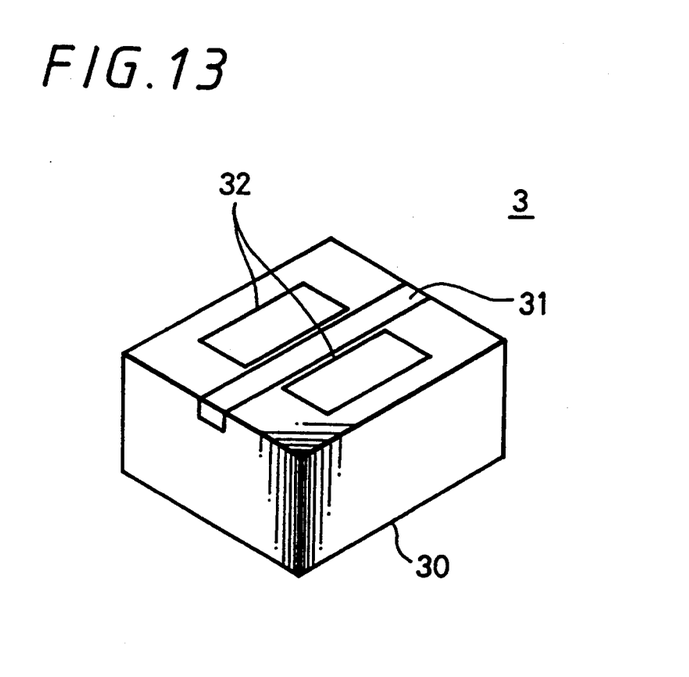
FIG. 13 is a perspective view of one example of the external frequency modulator.

The external frequency modulator 3 used in FIGS. 2 and 10 has an optical waveguide 31 provided in a nonlinear crystal substrate 30 as shown in FIG. 13. The optical waveguide conducts the laser beam fed from the semiconductor laser LD. An electrode 32 is provided on, for example, both sides of the optical waveguide. A modulating voltage is applied to these electrodes. The electric field applied to the waveguide 31 controls the frequency of the guided light by use of its opto-electric effect, or by changing the refractive index to the guided light.

This external frequency modulator 3 may be formed in the same crystal to be integral with the nonlinear optical element 2 of, for example, QPM type given in FIG. 12. That is, the electrode 32 given in FIG. 13 is provided on both sides of the optical waveguide 21 as indicated by the chain line in FIG. 12, or the external frequency modulator 3 is built up within the nonlinear optical element 2 which is used as, for example, SHG.

In addition, the nonlinear optical element 2 of the above construction can be formed as the SHG of Cherenkov radiation type, and the nonlinear optical crystal is not limited to KTP, but may be $LiTa_xNb_{1-x}O_3$ $(0 \leq x \leq 1)$.

According to the arrangement of the invention, since the oscillation wavelength of the semiconductor laser LD is electrically controlled to coincide with the wavelength at which the conversion efficiency of the nonlinear optical element 2 is the maximum, it is not necessary to severely control the temperature of the semiconductor laser LD and nonlinear optical element 2. In addition, since the reference wavelength in the wavelength control is always the wavelength at which the conversion efficiency of the nonlinear optical element is the maximum, it is possible to suppress, for example, the drift of the intensity of the light harmonic output in the nonlinear optical element 2, and thus to realize a stable system at all times.

Since this system itself can be formed of only a simple electric control circuit, it is easy to produce the system. Furthermore, in the nonlinear optical element 2 having the quasi phase matching structure QPM, the conversion efficiency can be increased by the increase of the polarity inversion region length, but there is a problem that the light harmonic generation wavelength band becomes narrow. Since this method can be applied to the nonlinear optical element of a very narrow wavelength band, it is possible to stabilize the nonlinear optical element with a larger conversion efficiency. Also, it is possible to modulate by the very small signal frequency used in the wavelength control or by a frequency higher than the frequency band (f) in the electric control system. That is, it is possible to make the high-frequency intensity modulation directly by the injection current to the semiconductor laser (fm>f, where fm is the modulation frequency).

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

We claim:

1. A wavelength converter, comprising:
   a light source for producing laser light at a frequency $\omega$ when supplied with an injection current;
   a nonlinear optical element for producing light output centered about frequencies $\omega$ and $2\omega$;
   an external frequency modulator provided between said light source and said nonlinear optical element;
   an oscillator for producing an oscillation signal;
   a transducer means for converting said light output from said nonlinear optical element and centered about frequencies $\omega$ into an electrical output signal;
   a multiplier for multiplying said oscillation signal and said electrical output signal; and
   a control circuit, receiving said multiplied output, for generating said injection current for said laser light source in accordance with said multiplied output signal.

2. An optical wavelength converter according to claim 1, wherein a correlation is detected from between a very small variation modulation signal to said external frequency modulator and a variation signal resulting from said transducer means of a variation component of a fundamental wave from said nonlinear optical element, an error signal is derived from the difference between an input fundamental wavelength to said nonlinear optical element and said fundamental wavelength at which the wavelength conversion efficiency of said nonlinear optical element is maximum and which can be obtained from said correlation, and said error signal is negatively fed back in the direction in which the wavelength of said input fundamental wave coincides with the fundamental wavelength at which the wavelength conversion efficiency of said nonlinear optical element is maximum, whereby the output wavelength of said external frequency modulator is made equal to the wavelength at which the wavelength conversion efficiency of said nonlinear optical element is maximum.

3. A wavelength converter according to claim 1, wherein said nonlinear optical element is a light harmonic generating element.

4. A wavelength converter according to claim 1, wherein said nonlinear optical element has a quasi-phase matching structure.

5. A wavelength converter according to claim 1, wherein said nonlinear optical element is a Cherenkov-type nonlinear optical element.

6. A wavelength converter according to claim 1, wherein said nonlinear optical element is made of $Li\text{-}Ta_xNb_{1-x}O_3$.

7. An optical frequency converter, comprising:
a laser light source for producing laser light at a frequency $\omega$ when supplied with an injection current;
an oscillator for producing an oscillation signal;
a frequency modulator receiving said oscillation signal and said laser light at frequency $\omega$ and producing a frequency modulated laser light centered about frequency $\omega$;
a nonlinear optical element receiving said frequency modulated laser light centered about frequency $\omega$ and producing light output centered about frequencies $\omega$ and $2\omega$;
a separating means for separating said light output into a first path at frequency $\omega$ and a second path at frequency $2\omega$;
transducer means for converting light in said first path into an electrical output signal;
a multiplier for multiplying said oscillation signal and said electrical output signal; and
a control circuit, receiving a multiplied output signal from said multiplier for generating said injection current for said laser light source in accordance with said multiplied output signal.

8. An optical frequency converter according to claim 7, wherein a correlation is detected from between a very small variation modulation signal to said frequency modulator and a variation signal resulting from said transducer means of a variation component of a fundamental wave from said nonlinear optical element, an error signal is derived from the difference between an input fundamental wavelength to said nonlinear optical element and a fundamental wavelength at which the wavelength conversion efficiency of said nonlinear optical element is maximum and which can be obtained from said correlation, and said error signal is negatively fed back in the direction in which the wavelength of an input fundamental wave coincides with the fundamental wavelength at which the wavelength conversion efficiency of said nonlinear optical element is maximum, whereby the output wavelength of said frequency modulator is made equal to the wavelength at which the wavelength conversion efficiency of said nonlinear optical element is maximum.

9. An optical frequency converter according to claim 8, wherein said separating means is a dichroic mirror.

10. An optical frequency converter according to claim 7, wherein a correlation is detected from between a very small variation modulation signal to said frequency modulator and a variation signal resulting from said transducer means of a variation component of a wavelength converted output wave, an error signal is derived from the difference between an input fundamental wavelength to said nonlinear optical element and a fundamental wavelength at which the wavelength conversion efficiency of said nonlinear optical element is maximum and which can be obtained from said correlation, and said error signal is negatively fed back in the direction in which the wavelength of an input fundamental wave coincides with the fundamental wavelength at which the wavelength conversion efficiency of said nonlinear optical element is maximum, whereby the output wavelength of said frequency modulator is made equal to the wavelength at which the wavelength conversion efficiency of said nonlinear optical element is maximum.

11. An optical frequency converter according to claim 7, wherein said nonlinear optical element is a light harmonic generating element.

12. An optical frequency converter according to claim 7, wherein said nonlinear optical element has a quasi-phase matching structure.

13. An optical frequency converter according to claim 7, wherein said nonlinear element is a Cherenkov-type nonlinear optical element.

14. An optical frequency converter according to claim 7, wherein said nonlinear optical element is made of $LiTa_xNb_{1-x}O_3$.

15. An optical frequency converter according to claim 7, wherein said separating means is a dichroic mirror.

16. An optical frequency converter according to claim 7, wherein a frequency of said oscillation signal is from 100 Hz to 100 MHz.

17. An optical frequency converter according to claim 7, wherein said oscillation signal has an AC component of in the range from 0.001% to 10% with respect to the DC component of said injection current supplied into said laser light source.

18. A wavelength converter comprising:
a light source;
a nonlinear optical element having a quasi-phase matching structure;
an external frequency modulator; and
wherein light from said light source is fed to an external frequency modulator, the output light from said external frequency modulator is incident to said nonlinear optical element as an input fundamental wave, and a very small modulation signal is supplied to said external frequency modulator, changing the wavelength of said input fundamental wave to said nonlinear optical element by a very small amount so that the output light from said external frequency modulator is pulled in the wavelength at which the wavelength conversion efficiency of said nonlinear optical element is the maximum.

19. A wavelength converter comprising:
a light source;
a nonlinear optical element being a Cherenkov-type nonlinear optical element;
an external frequency modulator; and
wherein light from said light source is fed to an external frequency modulator, the output light from said external frequency modulator is incident to said nonlinear optical element as an input fundamental wave, and a very small modulation signal is supplied to said external frequency modulator, changing the wavelength of said input fundamental wave to said nonlinear optical element by a very small amount so that the output light from said external frequency modulator is pulled in the wavelength at which the wavelength conversion efficiency of said nonlinear optical element is the maximum.

20. A wavelength converter comprising:
a light source;
a nonlinear optical element made of $LiTa_xNb_{1-x}O_3$;
an external frequency modulator; and
wherein light from said light source is fed to an external frequency modulator, the output light from said external frequency modulator is incident to said nonlinear optical element as an input fundamental wave, and a very small modulation signal is supplied to said external frequency modulator, changing the wavelength of said input fundamental wave to said nonlinear optical element by a very small amount so that the output light from said external frequency modulator is pulled in the wavelength at which the wavelength conversion efficiency of said nonlinear optical element is the maximum.

* * * * *